United States Patent
Schuurman et al.

(10) Patent No.: US 6,215,681 B1
(45) Date of Patent: Apr. 10, 2001

(54) BUS BAR HEAT SINK

(75) Inventors: Derek C. Schuurman, Drayton; Robert G. Lankin, Newton; Richard J. Hellinga, Waterloo, all of (CA)

(73) Assignee: Agile Systems Inc., Waterloo (CA)

( * ) Notice: Subject to any disclaimer, the term of this patent is extended or adjusted under 35 U.S.C. 154(b) by 0 days.

(21) Appl. No.: 09/436,992

(22) Filed: Nov. 9, 1999

(51) Int. Cl.[7] .................... H02M 7/68; H05K 7/20
(52) U.S. Cl. .................. 363/141; 174/70 C; 361/637
(58) Field of Search .................. 363/141; 174/70 B, 174/70 C, 72 B; 361/637, 611, 624

(56) References Cited

U.S. PATENT DOCUMENTS

| | | |
|---|---|---|
| 4,369,485 * | 1/1983 | Bell et al. .................. 361/386 |
| 4,446,188 | 5/1984 | Patel et al. . |
| 4,866,571 | 9/1989 | Butt . |
| 5,038,132 * | 8/1991 | Lindblom et al. .................. 338/307 |
| 5,223,676 | 6/1993 | Yamamoto et al. . |
| 5,837,556 * | 11/1998 | Ostendorf et al. .................. 434/4 |
| 6,028,878 * | 2/2000 | Agarwar et al. .................. 372/50 |

* cited by examiner

*Primary Examiner*—Peter S. Wong
*Assistant Examiner*—Bao Q. Vu
(74) *Attorney, Agent, or Firm*—R. Craig Armstrong

(57) ABSTRACT

A multiple current path device, for carrying electric current to and conducting heat from an electronic circuit, comprising an optional heat sink, a plurality of conducting substrates forming several electrically insulated current conductors, a thermally conductive, electrically insulating first layer, bonding each conducting substrate and the heat sink, and a plurality of electronic or electric components bonded to the substrates.

22 Claims, 7 Drawing Sheets

BUS BAR HEAT SINK

BACKGROUND OF THE INVENTION

1. Field of the invention

The invention relates to a device to carry electric current and conduct heat. Especially devices for high electric current applications, where there is a strong need to evacuate heat generated in electronic or electric components.

2. Description of the Prior Art

In the prior art, high current conductors are shown mixed in a printed circuit board together with low signal conductors. See, for example, U.S. Pat. No. 5,223,676 (Yamamoto), U.S. Pat. No. 4,446,188 (Patel et. al).

The use of an embedded heat sink is shown in U.S. Pat. No. 4,886,571 (Butt), using a separate electric conductor to connect to a semiconductor mounted onto the heat sink.

The prior art has the apparent drawback of not providing a flexible (easily adaptable to different product requirements) current conducting system which provides adequate heat transfer from the heat generating components.

SUMMARY OF THE INVENTION

It is an object of the invention to provide a device which carries electronic and electric components, supplies them with a plurality of high current electric flows and conducts the heat generated in the components away from the components themselves, and accomplishes these tasks using a minimum of space and in a non-complicated mechanical arrangement. The manufacture of the device according to the invention is possible in existing production lines, without any alteration of the manufacturing machines.

In the invention, a basic "sandwich" structure is used, capable of efficient heat transfer and high current carrying capacity. The structure is capable of forming a power circuit with multiple current paths.

The multiple current path device, for carrying electric current to and conducting heat from an electronic circuit, according to the invention preferably has the following components:

- a heat sink,
- a plurality of electrically and thermally conducting substrates forming several, from each other electrically insulated, current conductors,
- a thermally conductive, electrically insulating first layer, bonding each conducting substrate and the heat sink, and
- a plurality of electronic or electric components electrically and thermally connected to the conducting substrates.

The device preferably further comprises a plurality of printed circuits arranged on any of the conducting substrates, each printed circuit being electrically insulated from the conducting substrate. The device further advantageously comprises a plurality of thermally conductive, electrically insulating second layers bonding the conducting substrate and the individual printed circuits. Still further, the conducting substrates may have electrically conductive vias, which conduct current between said conducting substrates and said printed circuits.

Each individual electronic or electric components is advantageously fastened on one individual conducting substrate, or may bridge two or more conducting substrates or two or more printed circuits. Alternatively, each individual electronic or electric components may be fastened to bridge one printed circuit and one conducting substrate.

The conducting substrates are preferably substantially flat and rectangular.

The device according to the invention preferably comprises two, three, four or five conducting substrates.

Each of said conducting substrates may preferably have a power connection, for connecting to a current carrier. The power connection may be a bolt means or be a protrusion of the conducting substrate itself.

The device according to the invention may preferably be a half bridge electric power circuit, a full bridge electric power circuit or a 3-phase bridge electric power circuit.

A further embodiment of the device according to the invention further comprises a substantially thermally insulating fibre-glass reinforced resin board, bonded to the thermally conductive, electrically insulating first layer with the use of an adhesive layer and is electrically connected to the plurality of electrically and thermally conducting substrates via one or more of the electronic components. The resin board preferably has one or more layers of printed circuit patterns electrically connected to the electric components.

BRIEF DESCRIPTION OF THE DRAWINGS

In order that the invention may be more clearly understood, the preferred embodiment thereof will now be described in detail by way of example, with reference to the accompanying drawings, in which.

DETAILED DESCRIPTION OF THE INVENTION

Figure 1A:
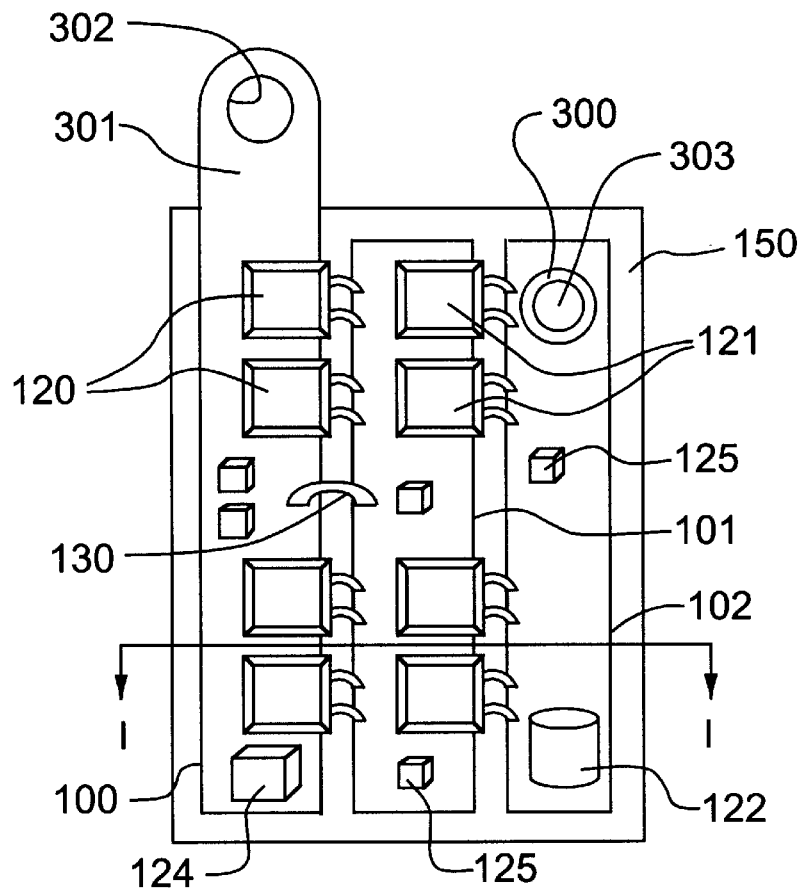
FIG. 1A is a schematic top view of a device according to the invention showing three conducting substrates with a common heat sink and the associated components.
Figure 1B:
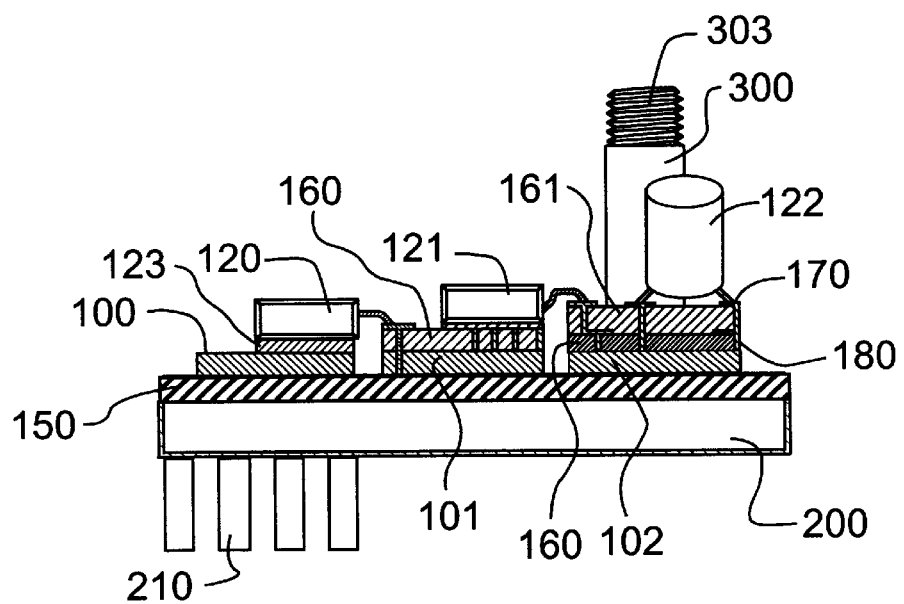
FIG. 1B is a schematic sectional side view along line I—I of FIG. 1A.
Figure 3A:
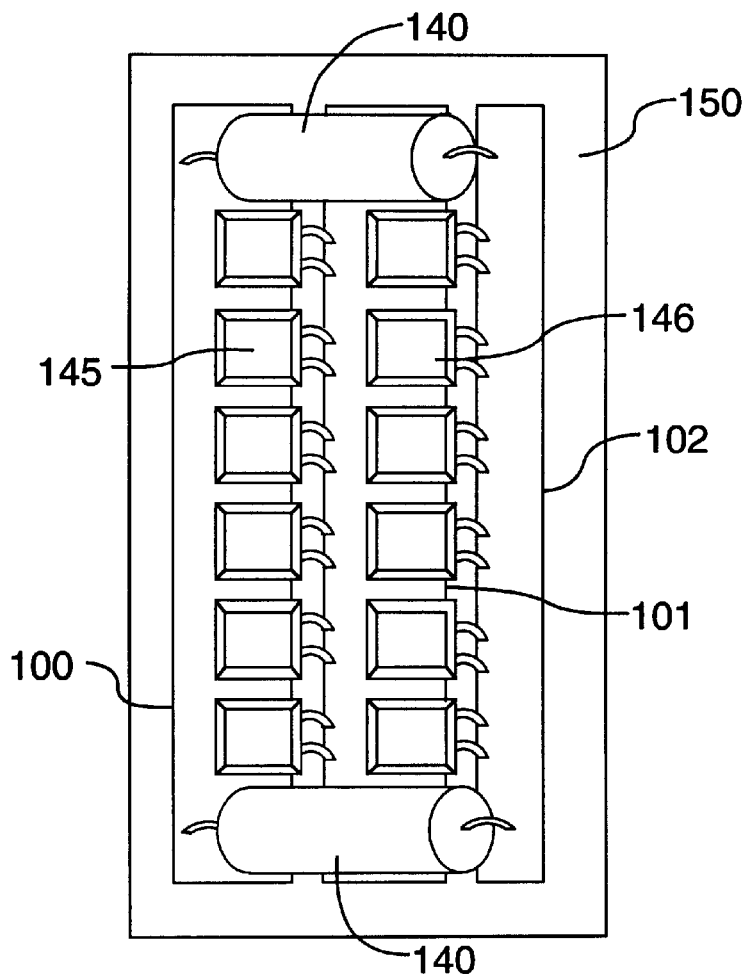
FIG. 3A is a schematic top view of a half-bridge device according to the invention.

FIGS. 1A, 1B and 3A show an embodiment of the invention having three electrically and thermally conducting substrates 100, 101, 102 arranged side-by-side on a common heat sink 200. The heat sink is preferably made of aluminum.

The invention is not limited to three substrates, any number of conducting substrates may be used, the number being determined by the number of separate current flows used in a particular application. Preferably, two, three, four or five conducting substrates are used. The preferred material for the conducting substrates is copper, but any conducting material may be used, such as any metal, metal alloy or semi-conductor. The conducting substrates may have an arbitrary shape, but a generally flat configuration having a contoured edge is preferred. For instance, substantially flat and rectangular, elliptical or round shapes are useful. Alternatively, any number of protrusions or indentations in the contour may be used, depending upon the application, for example to connect components between one or more conductive substrates.

A thermally conductive, electrically insulating first layer 150 is arranged between the conducting substrates 100, 101, 102 and the heat sink 200, to provide a bond between them. For applications where the power dissipation is relatively low, the substrates themselves act as sufficient cooling means, thus the heat sink 200 and the thermally conductive, electrically insulating first layer 150 may be omitted for these applications. For higher power dissipation applications, the heat sink is necessary. Onto each conducting substrate individual printed circuits 170 optionally may be fastened, preferably via a thermally conductive, electrically insulating second layer 160, as is shown in FIG. 1B on the middle substrate 101. Optionally, further printed circuits may be affixed onto printed circuits already fastened to the conducting substrate, thus creating a multilayer printed circuit structure, as is shown in FIG. 1 B on the rightmost substrate 102. Each additional printed circuit would preferably be mounted to an earlier printed circuit with the thermally conductive, electrically insulating second layer 160 there-between. The shape of the printed circuits is either the same as the shape of the conducting substrates, or any desirable shape which fits within the contour of the substrate.

Electric or electronic components 120, 121, 124, 125 are soldered or otherwise connected to the circuit pattern on each printed circuit, for example via a bonding layer 123. The components may also be embedded into a multilayer printed circuit, as is already known. Alternatively, embedded components may be used with a one-layer printed circuit pattern together with multiple insulating layers to cover the component. Examples of components are electronic switches, diodes, resistors and MOSFETs of different types. Electrically conductive vias 180 are arranged to connect each individual conducting substrate 100, 101, 102 to those printed circuits which are connected to that particular substrate. The vias conduct electricity between the conducting substrate and the printed circuits. The components may be mounted either directly to a substrate, as is shown in FIG. 1 B on the leftmost substrate 100, or directly to an insulating second layer 160. In either case, the heat generated by the component will be led into the substrate and further to the heat sink. The substrates and/or printed circuits may also be electrically connected by inter-substrate connections 130.

The heat sink 200 may have fins 210 for added efficiency. The heat sink may preferably be used as one or more walls of an enclosure for the device (not shown). A lid (not shown) having a top portion and two side portions, will effectively enclose the electronics mounted on the device. The shape and size of the heat sink is governed by the amount of heat that has to be transported from the device. Components 120 may be soldered, or otherwise electrically connected to the printed circuits or directly to the substrates 100, 101, 102 to reach between two printed circuits mounted onto two different conducting substrates 100, 101, 102 or reach between two substrates or between a printed circuit and a substrate. Power connections to the conducting substrates may be realized as a self-clinching bolt 300 having a threaded connector portion 303, or by making the conducting substrates themselves have a protrusion 301 with mounting holes 302. The protrusions would reach out from the final package, to act as terminals.

The same general buildup of the sandwich lends itself to applications such as VLSI, bare die and hybrid modules construction. As long as the heat generating components can be mounted to the substrates or the second insulating layers in a way to ensure sufficient heat transfer, any type of component is envisioned to be used with the device according to the invention.

Figure 2A:
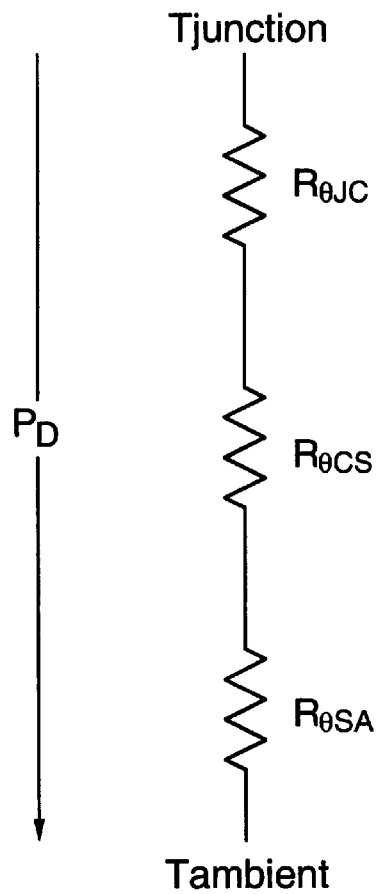
FIG. 2A is a schematic diagram of the heat dissipation mechanism of a device according to the invention.

The multiple current path device, for carrying electric heat and conducting heat from an electronic circuit, according to the invention, has great advantages in the area of combined heat conducting and electric current conducting capabilities. The junction temperature, i.e. the temperature at the core or die of the component, is determined by the power dissipation of the component and the thermal resistances. The desire is to keep this junction temperature below a certain maximum temperature, which depends on the component used. In general, the junction temperature of a device in steady state can be expressed as (see FIG. 2A):

$$T_{junction} = P_D * (R_{\Theta JC} + R_{\Theta CS} + R_{\Theta SA}) + T_{ambient}$$

Where
$P_D$=power dissipation of the component,
$R_{\Theta JC}$=Thermal resistance from junction to case
$R_{\Theta CS}$=Thermal resistance from case to sink
$R_{\Theta SA}$=Thermal resistance from sink to ambient
$T_{junction}$=junction temperature
$T_{ambient}$=Ambient temperature An important goal, as mentioned above, is to minimize the junction temperature to reduce stress on the component and make the design more robust. In addition, lower average junction temperature in semiconductor switches generally leads to longer component lifetimes. Finally, in designs in which multiple positive temperature coefficient devices are parallelled (eg. MOSFETs) the sharing between the components is improved with lower thermal drops between components. $R_{\Theta JC}$, being the thermal resistance from junction to case, is a device parameter over which the circuit designer has no control. However, $R_{\Theta CS}$ and $R_{\Theta SA}$ are parameters which are controlled by the designer. $R_{\Theta SA}$ can be minimized by selecting a larger heat sink for conductive cooling or improving surface area and air velocity for convective cooling. $R_{\Theta CS}$ can be reduced by using clever approaches to mounting the devices. Typically, this thermal resistance can be quite large resulting from the electrically insulating material placed between the package of the components and the heat sink, and will vary with material thickness and mounting pressure.

Figure 2B:
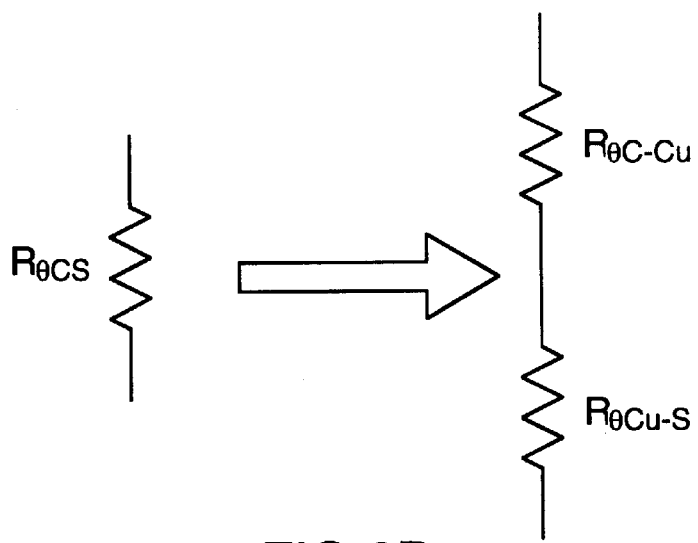
FIG. 2B is a schematic diagram of the thermal resistance from case to sink for a cased electronic component.

In the invention, the thermal resistance from case to sink, $R_{\Theta CS}$, is split into two small series components: the thermal resistance from the component case to the conducting substrate ($R_{\Theta C-Cu}$) and the thermal resistance from the conducting substrate to the heat sink ($R_{\Theta Cu-S}$), as shown in FIG. 2B. The $R_{\Theta C-Cu}$ thermal resistance is extremely small since it will normally be directly connected with solid conducting vias from the top printed circuit layer to the conducting substrate. The $R_{\Theta Cu-S}$, thermal resistance is also extremely small since the area between the conducting substrate and the heat sink is quite large. Generally, thermal resistance has the following relationship:

$$R_\Theta \propto 1/(\text{Area})$$

The effective area of dissipation through the insulating material thus effectively "heatspreads" from an area on the order of the size of the device to the area of the conducting substrate. The conducting substrate can be made large and hence the thermal resistance can be dramatically lowered.

The device according to the invention also has transient thermal impedance advantages. The heat capacity of the conducting substrate is quite large compared to a single component. Also, the thermal resistance $R_{\Theta C\text{-}Cu}$ is quite small (as described above). Therefore, the components now have a low resistance thermal path to a large heat capacitance resulting in a greatly improved transient thermal impedance. This results in a more rugged design capable of withstanding a higher peak power dissipation and higher peak currents.

Typically, electric resistance is expressed as:

$$R = (\text{length})/(\rho \sim \text{Area})$$

Where $\rho$ is conductivity (a property of the material). A substrate comprising a conductor, such as copper, with a low resistivity is capable of carrying very large currents. The current handling capability of the conducting substrate can be increased arbitrarily by simply using a thicker substrate and/or increasing the width of the substrate. Also, this approach is well suited for conducting high frequency signals since the skin-effect is reduced by the intrinsically large surface area of the conducting substrate conductor. With judicious layout of the relative positions of the conducting substrates, the effective loop areas and hence inductance may also be kept to a minimum.

The invention may have different embodiments, apparent to the person skilled in the art after learning the inventive concept:

The conducting substrate "islands" may be of arbitrary shape.

The number of conducting substrate "islands" is not fixed. Typically there will be one distinct conducting substrate for every high-current node in the circuit.

The number of layers on the printed circuit is not limited to one. A single layer is, however, most cost effective.

The heat sink may not be a distinct mechanical part (added for the sole purpose of being a heat sink), but may actually be a structural part of the machine being controlled, for example the casing of an electric motor. The device according to the invention could then be placed either inside or outside on the motor casing.

The heat sink may be flat for conductive cooling mounting or provided with fins for convective cooling.

The conducting substrates may be arranged in a non-flat configuration, for example three substrates may be arranged in a triangular cross-section. This would simplify cross-connections between substrates.

Devices according to the invention can be used to realize:

A ½ bridge configuration on a sandwich as shown, using only one single layer of printed circuit.

3-phase bridge topology.

Any power circuit wherein the high current conducting paths/nodes each form a conducting substrate.

Figure 3B:
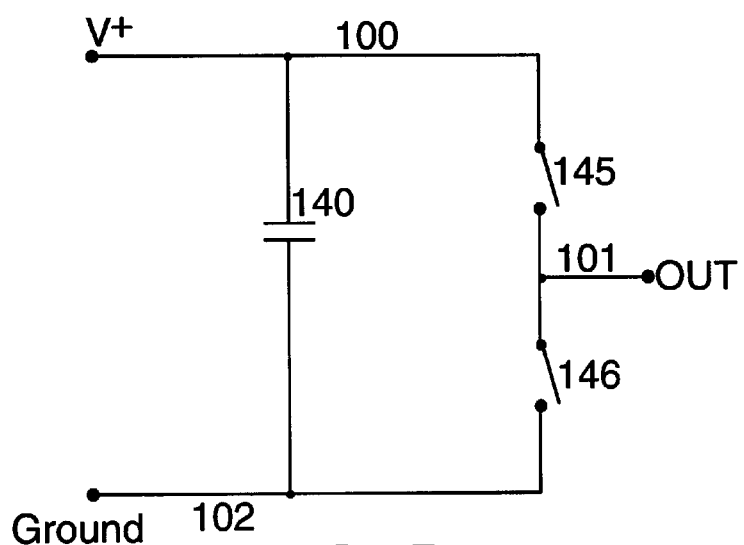
FIG. 3B is a schematic electric diagram of the device according to FIG. 3A.

A half bridge device according to the invention is shown in FIG. 3A. The electric diagram of this device is shown in FIG. 3B. The three substrates have different tasks: a positive supply substrate 100, a ground substrate 102 and an output substrate 101. Hi-side switches 145 connect the positive supply substrate and the output substrate and Lo-side switches 146 connect the ground substrate and the output substrate. Decoupling capacitors 140 connect the positive substrate and the ground substrate. The substrates are mounted on a heat sink 200 as described earlier. The switches are single or parallel devices, e.g. MOSFETs.

Figure 4A:
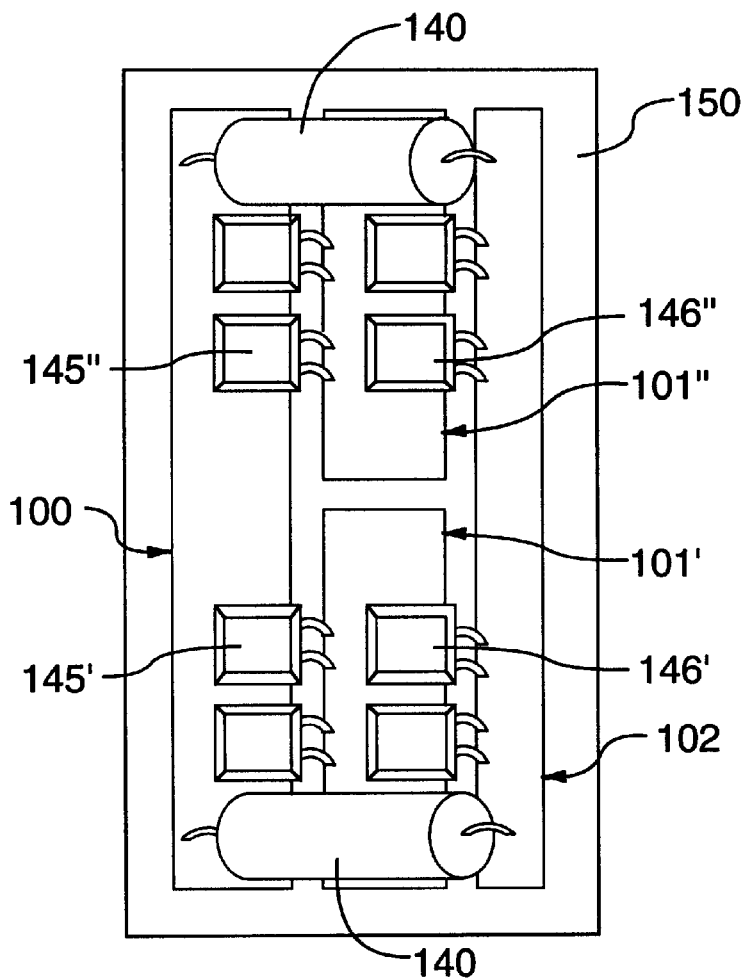
FIG. 4A is a schematic top view of a full-bridge device according to the invention.
Figure 4B:
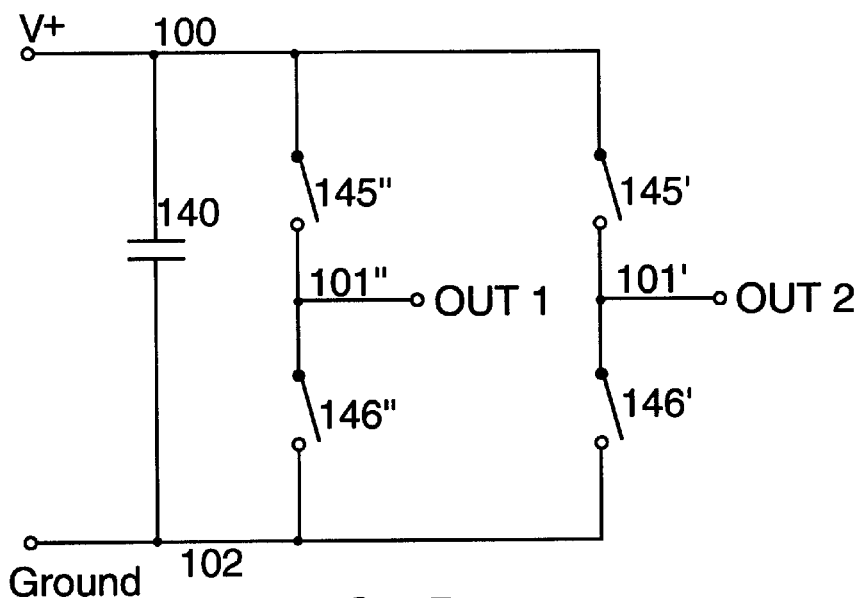
FIG. 4B is a schematic electric diagram of the device according to FIG. 4A.

A full bridge device according to the invention is shown in FIG. 4A. The electric diagram of this device is shown in FIG. 4B. The four substrates have different tasks: a positive supply substrate 100, a ground substrate 102 and an output substrate split into a first output substrate 101' and a second output substrate 101". A first set of Hi-side switches 145' connect the positive supply substrate and the first output substrate, and a second set of Hi-side switches 145" connect the positive supply substrate and the second output substrate. Similarly, a first set of Lo-side switches 146' connect the ground substrate and the first output substrate, and a second set of Lo-side switches 146" connect the ground substrate and the second output substrate. Decoupling capacitors 140 connect the positive substrate and the ground substrate. The substrates are mounted on a heat sink 200 as described earlier. The switches are single or parallel devices, e.g. MOSFETs.

Figure 5A:
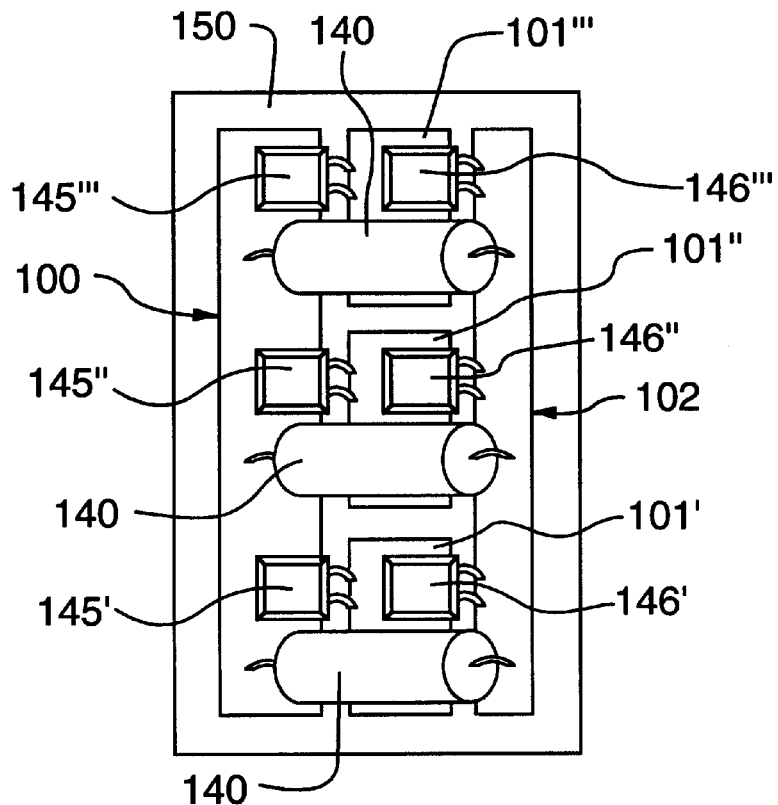
FIG. 5A is a schematic top view of a phase-bridge device according to the invention.
Figure 5B:
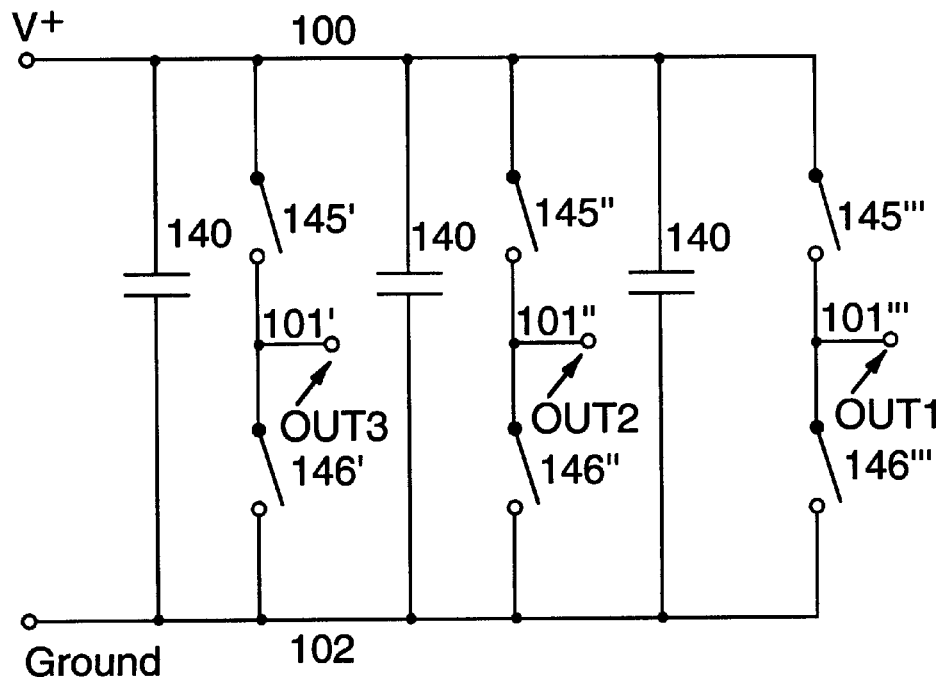
FIG. 5B is a schematic electric diagram of the device according to FIG. 5A.

A phase bridge device according to the invention is shown in FIG. 5A. The electric diagram of this device is shown in FIG. 5B. The five substrates have different tasks: a positive supply substrate 100, a ground substrate 102 and an output substrate split into a first phase output substrate 101', a second phase output substrate 101" and a third phase output substrate 101'". A first set of Hi-side switches 145' connect the positive supply substrate and the first output substrate, a second set of Hi-side switches 145" connect the positive supply substrate and the second output substrate, and a third set of Hi-side switches 145'" connect the positive supply substrate and the third output substrate. Similarly, a first set of Lo-side switches 146' connect the ground substrate and the first output substrate, a second set of Lo-side switches 146" connect the ground substrate and the second output substrate, and a third set of Lo-side switches 146'" connect the positive supply substrate and the third output substrate. Decoupling capacitors 140 connect the positive substrate and the ground substrate. The substrates are mounted on a heat sink 200 as described earlier. The switches are single or parallel devices, e.g. MOSFETs.

Figure 6:
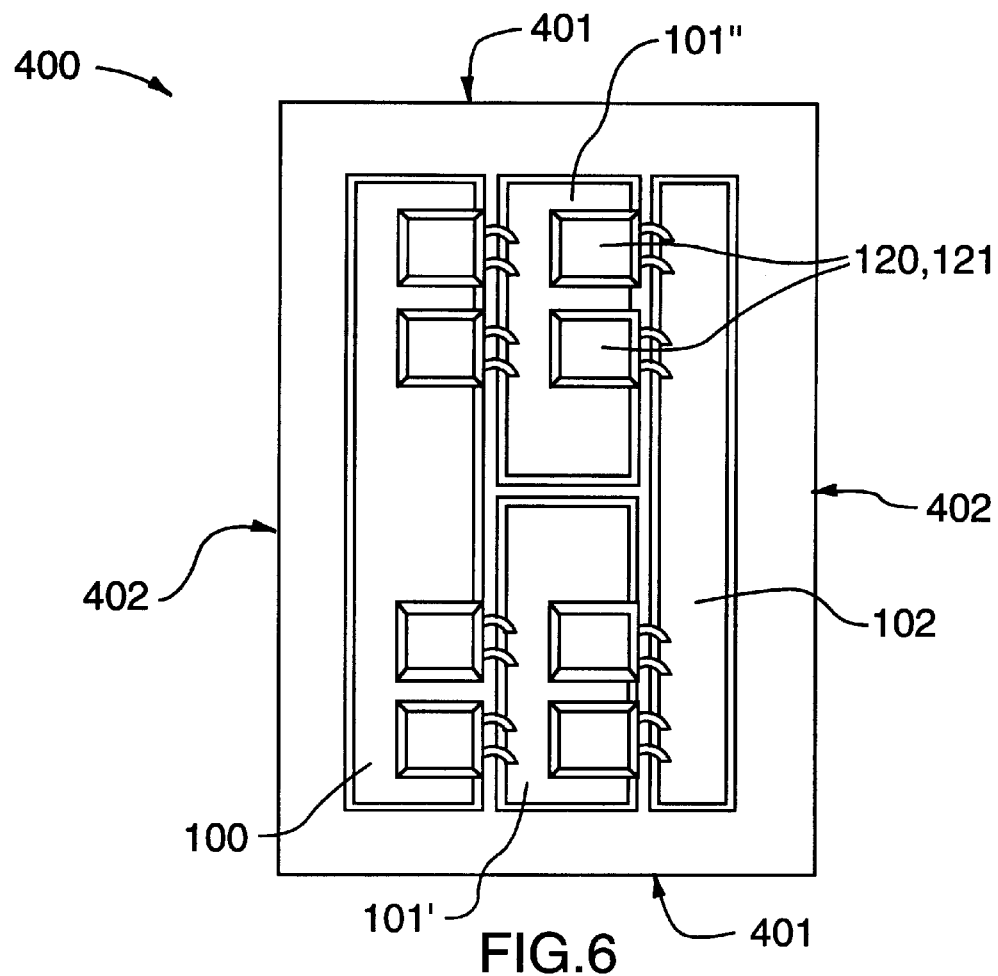
FIG. 6 is a schematic top view of a board fixture according to the invention.
Figure 7:
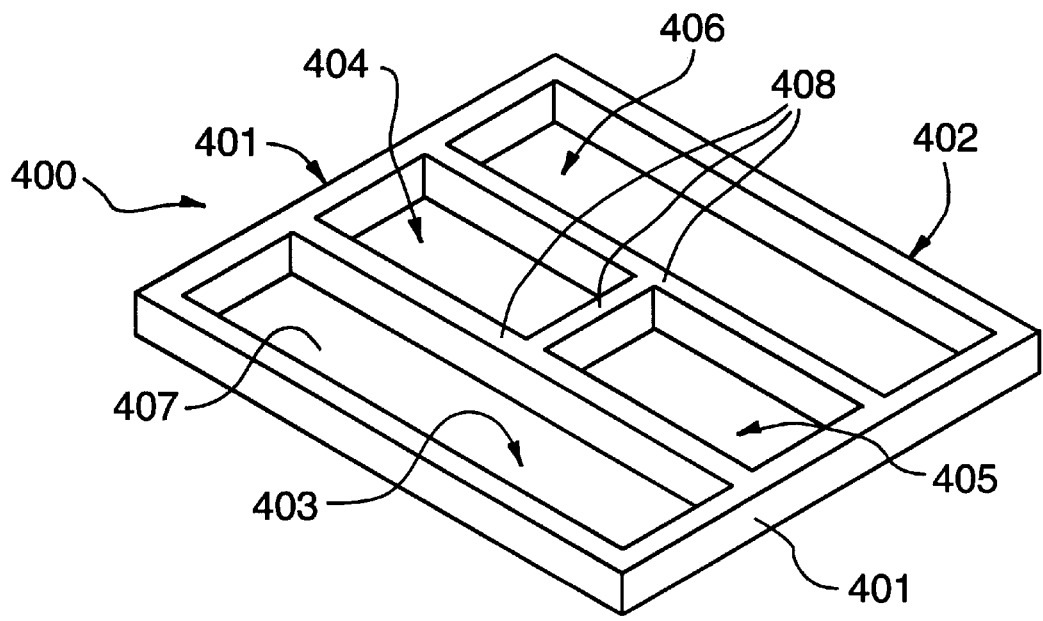
FIG. 7 is a schematic elevational side view of the fixture according to FIG. 6, but without individual substrates, i.e. an empty fixture.

Many applications would benefit from this approach including:

Motor controllers including
   electric vehicle motor controllers
   robot controllers
   linear motor drives Power converters
   resonant converters
   inverters (dc/ac)
   dc/dc converters
   ac/ac converters
   controlled ac/dc converters
   voltage/current regulators Loads
   dummy active loads
   over-voltage clamps The method of manufacturing the device according to the invention, requires no costly, specialized tools. The majority of the construction may be achieved using standard SMT assembly machinery. The multiple conducting substrates are preferably jigged to appear as one single substrate to the machinery. An embodiment of a single board framing means 400 (or jig) is shown in FIGS. 6 and 7. The jig has two short sides 401 and two long sides 402, together with a bottom 407. A plurality of compartments 403, 404, 405, 406 are arranged in the jig, separated by partition walls 408. Each compartment is deep enough to allow the upper surface of an inserted substrate to be substantially flush with the upper surface of the jig 400.

The example shown is a jig to hold substrates corresponding to the substrates of FIG. 4A: a positive supply substrate 100, a ground substrate 102 and an output substrate split into a first output substrate 101' and a second output substrate 101". The substrates are placed in the jig and the jig inserted into existing board manufacturing machines, where the components 120, 121 are mounted in their desired locations on the substrates. This results in the ability to use existing machines for building boards and no complex or costly fixtures or additional machinery is required. The multiple conducting substrates are simply arranged on the simple and cheap "substrate carrier" (jig 400) and then placed through the standard SMT pick-and-place and re-flow processes. One final additional step is attaching the finalized populated conducting substrate assembly to the heat sink.

Alternative embodiments of jigs are also useful. For example, a perforated base board having a multitude of holes may be used in conjunction with pegs inserted in desired locations on the base board, to form holders for individual substrates.

The assembly method of a device according to the invention thus preferably comprises the following steps:

Use of a "substrate holder" jig to register and hold multiple conducting substrates as one board.

Placement of electronic/electric components using standard pick and place machinery.

Standard SMT re-flow soldering through a standard oven, the temperature profile may need some modification due to increased heat capacity of the conducting substrates.

Standard testing using flying probes or equivalent techniques.

Optionally bonding conducting substrate assemblies to a heat sink.

Final mechanical assembly

Power connections to the conducting substrate may be realized using self-clinching bolts or by allowing the conducting substrates themselves to protrude from the final package to act as "bus bar terminals".

The heat sink may comprise all or part of the mechanical package.

Figure 8A:
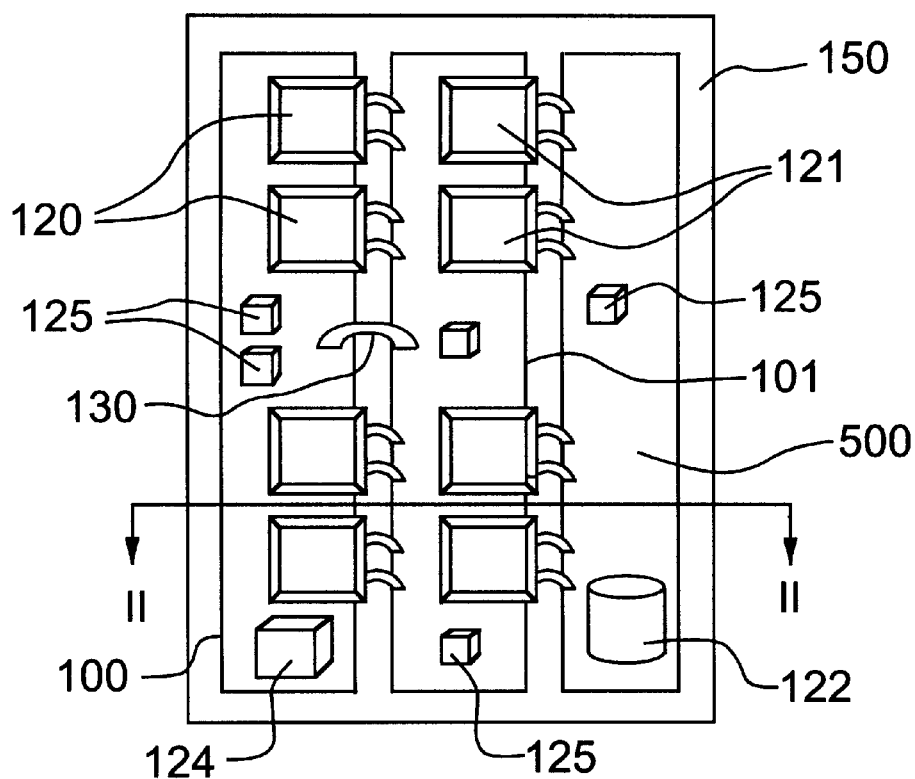
FIG. 8A is a schematic top view of a further embodiment of a device according to the invention.
Figure 8B:
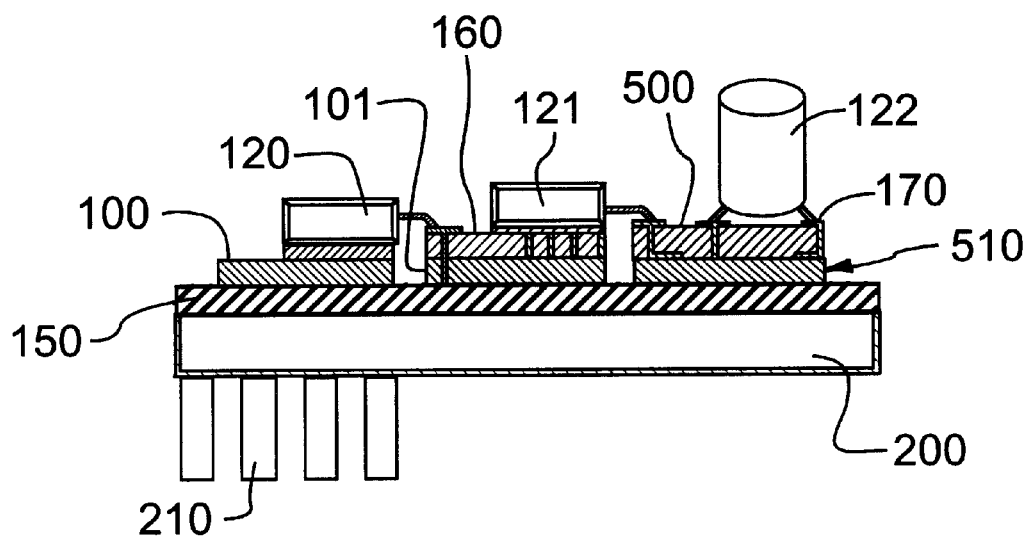
FIG. 8B is a schematic sectional side view along line II—II of FIG. 8A.

FIGS. 8A and 8B show a further embodiment of the invention having two conducting substrates 100, 101 arranged side-by-side on the common heat sink 200. The thermally conductive, electrically insulating first layer 150 is arranged between the conducting substrates 100, 101 and the heat sink 200, to provide a bond between them. A standard fibre-glass reinforced resin board 500, having one or more layers of printed circuits patterns is utilized as the "third substrate". The resin board is substantially thermally insulating, since no heat dissipating components are bonded to the resin board for cooling purposes. The resin board 500 is preferably bonded to the thermally conductive, electrically insulating first layer 150 with the use of an adhesive layer 510. Further reference numerals are identical to those previously used, and designate the same technical features as described above.

It will be appreciated that the above description relates to the preferred embodiments by way of example only. Many variations on the invention will be obvious to those knowledgeable in the field, and such obvious variations are within the scope of the invention as described and claimed, whether or not expressly described.

What is claimed is:

1. A multiple current path device for carrying electric current to and conducting heat from an electronic circuit, the device comprising:

a plurality of electrically and thermally conducting substrates forming several current conductors that are electrically insulated from each other, and a plurality of electronic or electric components electrically and thermally connected to said conducting substrates.

2. A device according to claim 1, wherein said device further comprises a heat sink and a thermally conductive, electrically insulating first layer, bonding each said conducting substrate and said heat sink.

3. A device according to claim 1, wherein said device further comprises a plurality of printed circuits arranged on any of the conducting substrates, each printed circuit being electrically insulated from said conducting substrate.

4. A device according to claim 3, wherein said device further comprises a plurality of thermally conductive, electrically insulating second layers bonding said conducting substrate and said individual printed circuits.

5. A device according to claim 3, wherein said conducting substrates have electrically conductive vias, which conduct electricity between said conducting substrates and said printed circuits.

6. A device according to claim 1, wherein each of said electronic or electric components are fastened on one individual conducting substrate.

7. A device according to claim 1, wherein said electronic or electric components are fastened to bridge two or more conducting substrates.

8. A device according to claim 3, wherein said electronic or electric components are fastened on one individual printed circuit.

9. A device according to claim 3, wherein said electronic or electric components are fastened to bridge two or more printed circuits.

10. A device according to claim 3, wherein said electronic or electric components are fastened to bridge one printed circuit and one conducting substrate..

11. A device according to claim 1, wherein said conducting substrates are substantially flat and rectangular.

12. A device according to claim 1, wherein said device comprises two conducting substrates.

13. A device according to claim 1, wherein said device comprises three conducting substrates.

14. A device according to claim 1, wherein said device comprises four conducting substrates.

15. A device according to claim 1, wherein said device comprises five conducting substrates.

16. A device according to claim 1, wherein each of said conducting substrates has a power connection, for connecting to a current carrier.

17. A device according to claim 16, wherein said power connection is a bolt means.

18. A device according to claim 16, wherein said power connection is a protrusion of the conducting substrate itself.

19. A device according to claim 1, wherein said device is a half bridge electric power circuit.

20. A device according to claim 1, wherein said device is a full bridge electric power circuit.

21. A device according to claim 1, wherein said device is a 3-phase bridge electric power circuit.

22. A device according to claim 1, wherein said device further comprises a substantially thermally insulating fibre-glass reinforced resin board, bonded to said thermally conductive, electrically insulating first layer with the use of an adhesive layer and electrically connected to said plurality of electrically and thermally conducting substrates via one or more of said electronic components, said resin board having one or more layers of printed circuits patterns electrically connected to said electric components.

* * * * *

UNITED STATES PATENT AND TRADEMARK OFFICE
CERTIFICATE OF CORRECTION

PATENT NO. : 6,215,681 B1
DATED : April 10, 2001
INVENTOR(S) : Schuurman, Derek C. et al.

It is certified that error appears in the above-identified patent and that said Letters Patent is hereby corrected as shown below:

Column 4,
Line 67, should read, -- The $R_{\theta Cu-S}$ thermal resistance is also extremely small since the area between the conducting substrate and the heat sink is quite large. --

Column 5,
Line 5, should read, -- $R_{\theta} \propto 1 / (Area)$ --
Line 24, should read, -- $R = (length) / (\rho \cdot Area)$ --

Signed and Sealed this

Twenty-seventh Day of November, 2001

Attest:

NICHOLAS P. GODICI
Attesting Officer    Acting Director of the United States Patent and Trademark Office